United States Patent
Aga et al.

(10) Patent No.: US 11,216,373 B2
(45) Date of Patent: Jan. 4, 2022

(54) MEMORY ACCESS COMMANDS WITH NEAR-MEMORY ADDRESS GENERATION

(71) Applicant: Advanced Micro Devices, Inc., Santa Clara, CA (US)

(72) Inventors: Shaizeen Aga, Santa Clara, CA (US); Nuwan Jayasena, Santa Clara, CA (US); Johnathan Alsop, Bellevue, WA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/887,713

(22) Filed: May 29, 2020

(65) Prior Publication Data

US 2021/0374055 A1    Dec. 2, 2021

(51) Int. Cl.
*G06F 12/06* (2006.01)
*G11C 11/408* (2006.01)

(52) U.S. Cl.
CPC ...... *G06F 12/0646* (2013.01); *G11C 11/4087* (2013.01); *G06F 2212/1041* (2013.01)

(58) Field of Classification Search
CPC ......... G06F 12/0646; G06F 2212/1041; G11C 11/4087
USPC ........................................................ 711/105
See application file for complete search history.

(56) References Cited

U.S. PATENT DOCUMENTS

| | | |
|---|---|---|
| 8,001,434 B1 | 8/2011 | Lee |
| 2010/0088487 A1 | 4/2010 | Yuasa |
| 2016/0098200 A1 | 4/2016 | Guz |
| 2016/0232088 A1* | 8/2016 | Mohan ............... G06F 12/0246 |
| 2017/0262369 A1 | 9/2017 | Murphy |
| 2020/0026498 A1 | 1/2020 | Sumbul |
| 2020/0051603 A1* | 2/2020 | Kitagawa .............. G11C 7/222 |
| 2020/0264884 A1* | 8/2020 | Jung ................... G11C 7/1045 |
| 2020/0286561 A1* | 9/2020 | Berger .................... G11C 8/10 |
| 2021/0073622 A1* | 3/2021 | Yudanov ............. G06F 12/0646 |

OTHER PUBLICATIONS

International Searching Authority "Search Report", in Application No. PCT/US2021/020566, dated Jun. 21, 2021, 12 pages.

* cited by examiner

*Primary Examiner* — Fernando Hidalgo
(74) *Attorney, Agent, or Firm* — Hickman Becker Bingham Ledesma LLP; Edward A. Becker

(57) ABSTRACT

A memory controller may be configured with command logic that is capable of sending a memory access command having incomplete address information via a command/address bus that connects the memory controller to memory modules. The memory controller may send the memory access command via the bus for accessing data stored at memory locations of the memory modules. The memory locations may correspond to different near-memory generated reflecting that the data is not address aligned across the memory modules. Nonetheless, because of the near-memory address generation, the memory controller can send the memory access command having incomplete address information for accessing the data stored at the different addresses, as opposed to having to send multiple memory access commands specifying complete address information on the bus for accessing the data at the different addresses, thereby conserving usage of the available bus bandwidth, reducing power consumption, and increasing compute throughput.

29 Claims, 6 Drawing Sheets

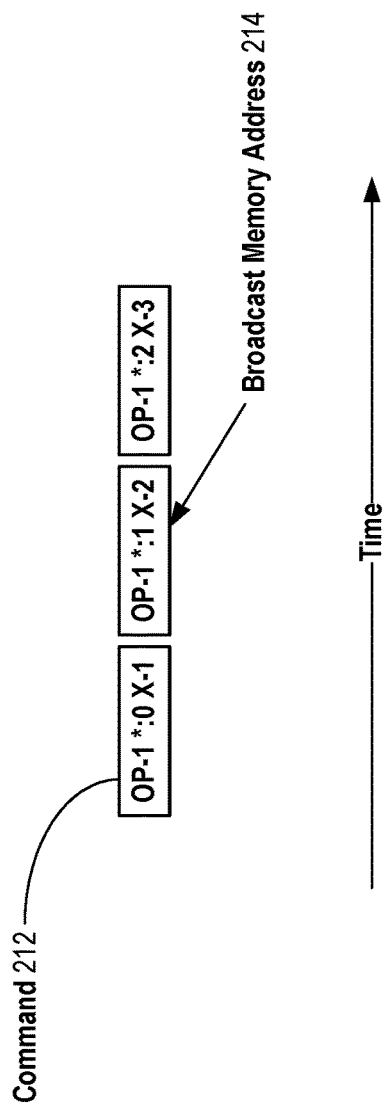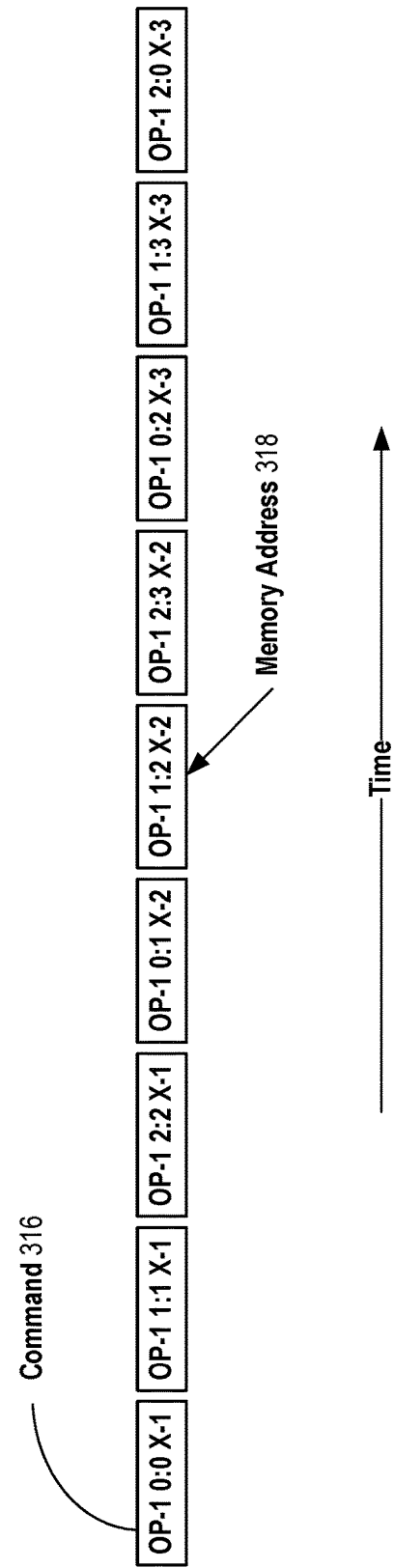

MEMORY ACCESS COMMANDS WITH NEAR-MEMORY ADDRESS GENERATION

TECHNICAL FIELD

Disclosed embodiments of memory access commands with near-memory address generation pertain generally to volatile and non-volatile computer memory and, more particularly, to computer-implemented logic for accessing data stored in computer memory.

BACKGROUND

Computer memory is a fundamental component of virtually every computer including personal computers, tablet computers, smartphones, server computers, and other computing devices such as, for example, printers and internet connected devices. Computer memory is typically used in computers to store data and processor-executable instructions (machine code) that operate on the data.

While the term "memory" is often used to refer to volatile computer memory such as, for example, dynamic random-access memory (or just "DRAM" for brevity) that takes the form of integrated circuit chips with metal-oxide semiconductor memory cells, computer memory can also be non-volatile. A non-exhaustive list of volatile and non-volatile computer technologies includes DRAM, static random-access memory (or just "SRAM" for brevity), non-volatile dual inline memory module (or just "NVDIMM" for brevity), flash memory, embedded DRAM, scratchpad memory, etc.

The computer memory of a computer is typically connected to a hardware "host" of the computer via a set of wire(s) or conductor(s) of the computer. The hardware host may encompass a memory controller and a central processing unit (or just "CPU" for brevity), a graphics processing unit (or just GPU for brevity), or other hardware data processor. The connection(s) between computer memory and the host typically encompasses an interface for command/address information (sometimes referred to as a "command/address bus") and an interface for data information (sometimes referred to as a "data bus").

Recently, the computing capabilities and the speed of processors (e.g., CPUs and GPUs) have been increasing faster than the bandwidth of the data bus connecting computer memory to the host. As a result, the data bus has become a bottleneck in computing throughput as the processor idly waits for data to be transferred to and from computer memory via the data bus.

Processor-in-memory (or just "PIM" for brevity) solutions provide data processing capabilities that are near the computer memory (e.g., on the same die). With PIM solutions, since data processing capabilities are near to the computer memory, computation can be performed on data accessed from computer memory without having to transfer all of the raw data over the data bus to the host. For example, a possible PIM solution may involve adding simple vector compute elements to each internal memory module of computer memory such as to each DRAM bank or sub-array. Then, with these additional elements, the host can trigger computation at all internal memory modules without requiring transfer of data across the DRAM interface across the data bus.

PIM solutions can conserve the consumption of bandwidth of the data bus by data transfers between computer memory and the host and improve throughput of compute workloads, especially for the growing category of data-limited compute workloads such as, for example, deep artificial neural network machine learning workloads, large-scale graph analytic workloads, sparse computations in machine learning workloads, among other types of compute-intensive workloads that can reach the bandwidth limit of the data bus with data transfers between the computer memory and the host in the absence of memory-local PIM units.

As but one example, a common operation in machine learning is a sparse embedding lookup. This operation can dominate execution time of some workloads. Such an operation can sparsely read large embeddings containing hundreds of elements out of a large embedding table containing millions of embedding entries stored in computer memory and accumulate them together. Because of the limited data reuse, such an operation can be highly sensitive to the bandwidth of the data bus.

Without using a PIM solution, a sparse embedding lookup operation might require the host issuing a set of memory load requests, one for each of a number of memory modules (e.g., DRAM banks). Each memory load request causes data to be transferred from a respective memory module to the host across the data bus. Since the memory modules may share the command/address bus and the data bus (e.g., DRAM banks on the same memory channel), access to the different memory modules may need to be serialized resulting in full utilization of both the command/address and data buses. In contrast, if a PIM solution is used, the accumulation can be computed in memory-local PIM units without requiring the transfer of some data on the data bus.

However, as PIM solutions can alleviate some or all of the data bus bottleneck for certain workloads, a bottleneck at the command/address bus can become a new bottleneck. For example, a bottleneck at the command/address bus can arise with data-limited compute workloads that have sparse or irregular memory access patterns such as those found with machine learning workloads and other workloads. Since the command/address bus is shared by the memory modules, each memory load command still needs to be sent across the command/address bus.

A possible solution to the command/address bus bottleneck is to increase the bandwidth of the command/address bus by increasing the number of memory channels or by increasing the number of command/address wires per memory channel. However, this increases the per-unit manufacturing cost and increases power consumption. Further, for workloads having regular memory access patterns, the extra command/address bus bandwidth may go unutilized.

Disclosed embodiments address this and other issues.

The approaches described in this section are approaches that could be pursued, but not necessarily approaches that have been previously conceived or pursued. Therefore, unless otherwise indicated, it should not be assumed that any of the approaches described in this section qualify as prior art, or are well-understood, routine or conventional, merely by virtue of their inclusion in this section.

BRIEF DESCRIPTION OF THE DRAWINGS

FIG. 2 illustrates an example series of memory access commands that may be sent by a memory controller via a command/address bus when data stored in memory locations of memory modules is address-aligned across memory modules.

FIG. 3 illustrates an example series of memory access command that may be sent by a memory controller via a command/address bus when data stored in memory locations of memory modules is not address-aligned across memory modules.

Figure 1:
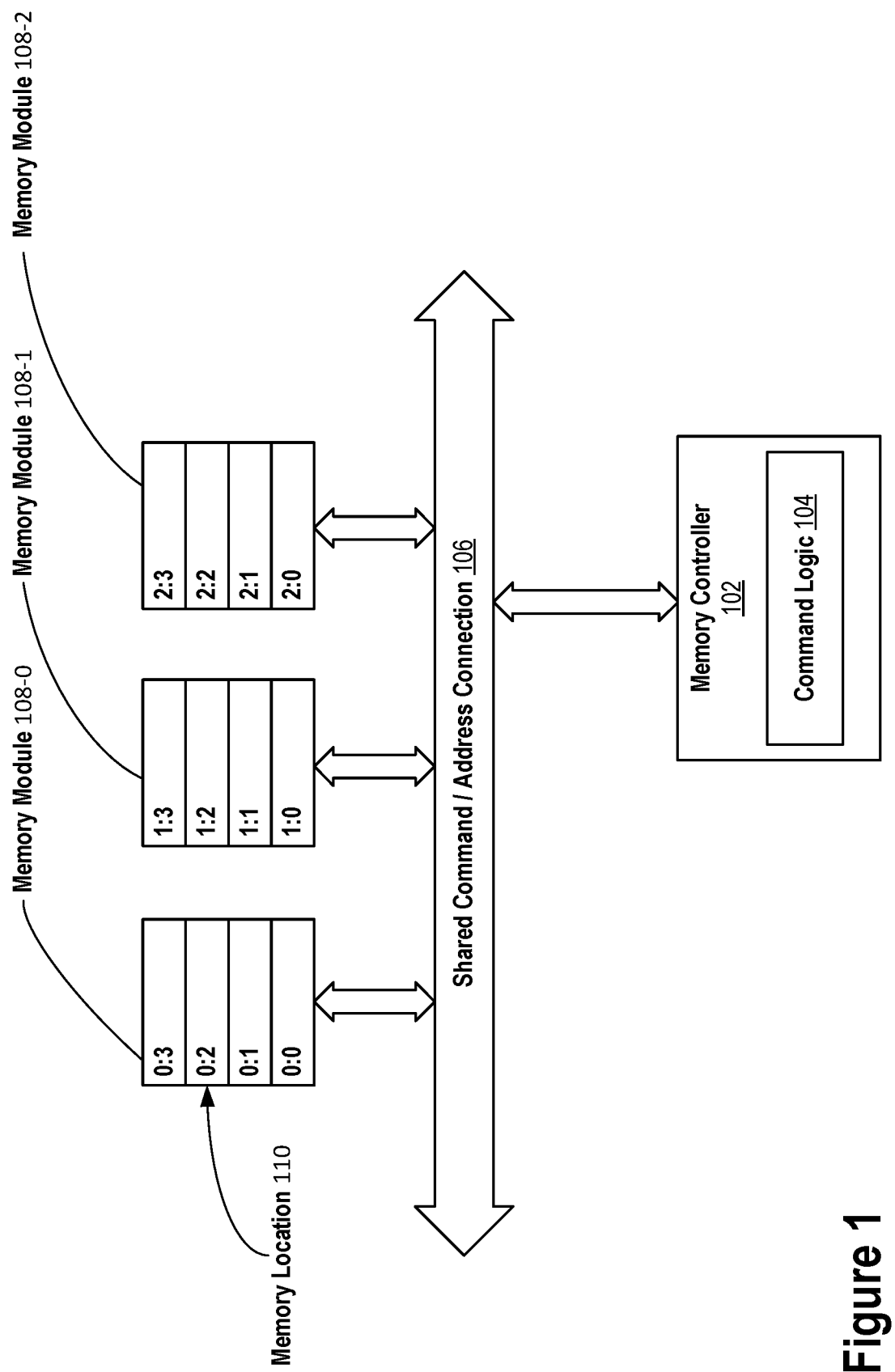
FIG. 1 is a schematic diagram of an example system for memory access commands with near-memory address generation, according to some embodiments.

In some embodiments, not all of the depicted components in each figure may be required, and some embodiments may include additional components not shown in a figure. Variations in the arrangement and type of the components may be made without departing from the scope of this disclosure. Additional components, different components, or fewer components may be utilized within the scope of this disclosure.

DETAILED DESCRIPTION OF EMBODIMENTS

In the following description, for the purposes of explanation, numerous specific details are set forth in order to provide a thorough understanding of embodiments of memory access commands with near-memory address generation. It will be apparent, however, that the embodiments may be practiced without these specific details. In other instances, well-known structures and devices are shown in block diagram form in order to avoid unnecessarily obscuring the embodiments.

SUMMARY OF SOME EMBODIMENTS

Systems and methods are disclosed for memory access commands with near-memory address generation. Some embodiments of such systems and methods may facilitate computer memory access for supporting (e.g., efficiently supporting) compute workloads including, but not limited to, deep machine learning workloads (e.g., using deep artificial neural networks), large-scale graph analytics, and/or other compute workloads with sparse or irregular memory accesses. The subject technology may be utilized in a variety of systems including, but not limited to, northbridge chipsets, field programmable array (or just "FPGA" for brevity) devices, microprocessor devices, CPU devices, GPU devices, memory integrated circuits and/or other systems, such as machine learning and/or artificial intelligence accelerator devices.

A memory controller may be configured with command logic that is capable of sending a memory access command having incomplete address information via a connection between the memory controller and two or more computer memory modules. In some embodiments, the incomplete address information may have no address information (address-less). In some embodiments, the incomplete address information may have partial address information. The memory controller may send the memory access command via the connection for accessing data stored at two or more memory locations of the memory modules. The memory locations may correspond to two or more near-memory generated addresses.

In some embodiments, the near-memory generated addresses corresponding to the memory locations are different reflecting that the data is not address aligned across the memory modules. Nonetheless, because of the near-memory address generation, the memory controller can send the memory access command having incomplete address information for accessing the data stored at the different addresses, as opposed to having to send multiple memory access commands specifying complete address information on the bus for accessing the data at the different addresses, thereby conserving usage of the available bus bandwidth, reducing power consumption and increasing compute throughput.

In some embodiments, the command logic of the memory controller is configured to send, via the connection, program address commands specifying addresses to the memory modules. These preprogrammed addresses may be stored near-memory, can be different for different memory modules, and can be leveraged across multiple memory access commands having incomplete address information, thereby avoiding having to send complete address information over the connection with each memory access command.

In some embodiments, a memory access command having incomplete address information may specify an operation (e.g., multiply or add) to be performed by PIM units of the memory modules. Because of the near-memory address generation, the sending of the single memory access command having incomplete address information can cause the PIM units to perform the operation on data stored in different memory modules even where the data is not address aligned across the memory modules.

A memory module of the memory modules may have a memory structure and a near-memory address generation unit. The memory structure may encompass addressable memory locations. The near-memory address generation unit may be configured to generate, near-memory, an address corresponding to a memory location of the memory structure. The near-memory address generation unit may be configured to generate the address based on receipt, at the memory module via the connection, of the memory access command having incomplete address information sent by the memory controller via the connection for accessing data stored at the memory locations of the memory modules corresponding to the near-memory generated addresses.

In some embodiments, the near-memory address generation unit includes a register file. The register file is configured to store the address to be generated by the near-memory address generation unit. In some embodiments, the address may be stored in the register file based on receipt, at the memory module via the connection, of a program address command specifying the address to be stored in the register file.

In some embodiments, the near-memory address generation unit includes an address calculation unit that is configured to compute the address to be generated by the near-memory address generation unit. In some embodiments, the address calculation unit computes the address to be generated based on applying a preconfigured stride to an address. In some embodiments, the address calculation unit computes the address to be generated based on a value obtained from a PIM unit of the memory module. In some embodiments, the address calculation unit computes the address to be generated based on a value obtained from a memory location of the memory structure.

In some embodiments, a memory controller comprises a command logic configured to send a first memory access command having incomplete address information via a connection for accessing data stored in a set of two or more rows, of a set of two or more memory modules, corresponding to a set of two or more near-memory generated row addresses. The command logic is also configured to send a second memory access command having incomplete address information via the connection for accessing data stored in a set of two or more columns, of the set of two or more memory modules, corresponding to a set of two or more near-memory generated column addresses.

In some embodiments, a memory module comprises a memory structure having a plurality of rows and a plurality of columns. The memory module also comprises a near-memory address generation unit configured to generate a row address corresponding to a row of the plurality of rows based on receipt, by the module via a connection, of a first memory access command for accessing data stored in the row. The near-memory address generation unit is further configured to generate a column address corresponding to a column of the plurality of columns based on receipt, by the module via the connection, of a second memory access command for accessing data stored in the column of the row.

Some embodiments support (e.g., efficiently support) CPUs, GPUs, and PIM units when processing compute workloads with irregular or sparse data accesses of computer memory. Such workloads include deep learning recommendation models and large-scale graph analytics that are increasingly prevalent in commercial, governmental, educational and research domains. Some embodiments allow such workloads to access memory faster and with lower power consumption.

These and other embodiments will now be described in greater detail with respect to the drawings.

Example System for Memory Access Commands with Near-Memory Address Generation

FIG. 1 is a schematic diagram of an example system for memory access commands with near-memory address generation, according to some embodiments. The system includes memory controller 102 electrically connected to command/address bus 106 shared by two or more memory modules 108 and to which memory modules 108 are also electrically connected. Electrical connections can be direct or indirect, where an indirect electrical connection may include additional structures in the electrical path.

The system may include other components that are not shown in FIG. 1. For example, the system may include other buses, chips and circuitry that is not shown in FIG. 1.

In the example of FIG. 1, three memory modules are depicted. However, the system may have as few as two memory modules or more than two memory modules including more than three memory modules. In addition to command logic 104, memory controller 102 may include other logics and structures that are not depicted in FIG. 1 such as request buffers, response buffers, memory mapping logic, and arbitration logic. In addition to being electrically connected to memory modules 108 by command/address bus 106, memory controller 102 may be electrically connected to memory modules 108 by other buses that are not depicted in FIG. 1 such as a data bus.

Memory controller 102 may include hardwired and/or programmed digital circuitry for managing the flow of data going to and from memory modules 108. Memory controller 102 can be a separate chip or integrated into another chip, such as being placed on the same die or as an integrated component of a microprocessor such a CPU or a GPU. In addition to command logic 104, memory controller 102 may also encompass logic for reading data from and writing data to memory modules 108. In the case memory modules 108 are volatile memory devices, memory controller 102 may include logic for periodically refreshing electrical charges in memory cells of memory modules 108, such as where memory modules 108 are implemented based on, for example, semiconductor DRAM.

By sharing command/address bus 106, a command sent by memory controller 102 for one, two or more or all of memory modules 108 can be sent via command/address bus 106. When a command is sent via command/address bus 106 from memory controller 102 to one or more of memory modules 108, the command may be sent from memory controller 102 to the one or more memory modules along only command/address bus 106 or along one or more additional electrical connections in the electrical path between memory controller 102 and the one or more memory modules.

Command/address bus 106 may encompass a set of one or more electrical wires or conductors for sending electrical signals representing commands including the program address commands and the memory access commands having incomplete address information disclosed herein. The electrical signals may be sent from memory controller 102 to memory modules 108 via command/address bus 106.

According to some embodiments, the connection between memory 102 controller and memory modules 108 may encompass an interface for sending and receiving command/address information such as, for example, memory access commands. This connection is labeled in FIG. 1 as command/address bus 106. The same connection or a separate connection between memory controller 102 and memory modules 108 may encompass an interface for sending and receiving data such as, for example, data accessed from memory locations. This connection is sometimes referred to herein as a "data bus." Although the term "bus" is used, the connection or connections may encompass a set of wire(s) or conductor(s), or other form of wired and/or wireless electrical coupling or connection(s) between memory controller 102 to memory modules 108. Further, as indicated, the command/address bus 106 and the data bus may share the same electrical connection between memory controller 102 and memory modules 108 or use separate electrical connections.

In some embodiments, command/address bus 106 may be composed of sub-buses. For example, command/address bus 106 may be composed of a row address bus and a column address bus among potentially other sub-buses.

Memory modules 108 provide addressable memory locations for storing data. In some instances, data stored at or accessed from a memory location is referred to herein as a "value" or a "data value." Such a value may be represented by one or more bits. In some instances, a memory location is byte addressable and stores an 8-bit data value. In some instances, a memory location is word addressable and stores a multi-byte data value (e.g., a 16-bit, a 32-bit, a 64-bit, or a 128-bit data value).

When a data value is accessed from a memory location (e.g., 110) of a memory module (e.g., 108-0) by a command sent by memory controller 102, the data value may be sent from the memory module back to the host via the data bus between memory modules 108 and the host. In addition, or alternatively, the data value may be sent to a PIM unit near the memory module for computation or accumulation by the PIM unit (e.g., multiply, add, etc.).

As used herein, the term "near-memory" encompasses in-memory such as in the same die, chip or circuit as a memory module (e.g., 108-0). More broadly, however, near-memory encompasses structures that are physically closer to the memory module than is the host or memory controller 102 at the other end of command bus 106 to the memory module.

In some embodiments, each of memory modules 108-0, 108-1, 108-2 is a DRAM bank. However, each memory module 108 may correspond to another type of component in a memory hierarchy such as a sub-array, a rank, or a channel. Furthermore, a memory module is not limited to volatile memory devices or DRAM devices and may include non-volatile memory devices or other types of memory devices with addressable memory locations.

In some embodiments, a near-memory address generation unit is used to generate addresses near-memory. A separate near-memory address generation unit can be located within each memory module 108-0, 108-1, and 108-2, for example. For example, where memory modules 108 are components of a stack of multiple memory layers on top of a base die, the near-memory address generation units can be located in the base die, or the near-memory address generation units can be located in the memory layers of three-dimensional stacked memories or in the memory layer of more traditional DRAM.

Near-memory address generation units can also be located in other forms of memory besides three-dimensional stacked DRAM and traditional DRAM such as, for example, non-volatile memories, flash memories, and embedded DRAM. While embodiments described below are in the context of DRAM memory structures, near-memory address generation units and the functionality thereof can be implemented in other memory contexts such as in the context of other forms of emerging memory technology or later development memory technology including non-volatile memory modules such as, for example, NVDIMMs, as well as other forms of memory such as scratchpad memory or the like.

Address-Aligned Data

According to some embodiments, the near-memory address generation units associated with memory modules 108 enables memory controller 102 to send memory access commands having incomplete addresses information such as no address information or only partial address information. Nonetheless, the near-memory address generation units are capable of generating addresses near memory to provide complete address information either entirely or in combination with partial address information specified in the memory access commands. By doing so, compute workloads such as machine learning and large-scale graph analytics and other compute workloads that result in irregular memory accesses are supported with reduced consumption of command/address bus 106 bandwidth and with lower power consumption.

For example, because of the near-memory address generation units associated with memory modules 108, a memory access command having incomplete address information can be sent from memory controller 102 via command/address bus 106 to two or more of memory modules 108 for accessing memory locations in different ones of memory modules 108 even if the memory locations are not address-aligned. For example, memory location 110 of memory module 108-0 is designated in FIG. 1 as having address "0:2". This notation is used for purposes of illustration only. The number preceding the colon ':' addresses (e.g., identifies) the memory module of memory modules 108 connected to command 106 (in this example "0"). The number following the colon ':' addresses the memory location within the addressed memory module (in this example "2"). In some cases, the portion of an address that addresses a particular memory location within a memory module addressed by the address is referred to herein as the "module-relative" address. In this example, the "2" following the colon would be the module-relative address of the address "0:2".

Again, it should be emphasized that the address notation of FIG. 1 is used for purposes of illustration in this disclosure only. A practical address may be multi-bit address having multiple components such as a some number of bits that address the memory module, some number of bits that address a row address of the addressed memory module, and some number of bits that address a column address of the addressed memory module, among other bit-represented information. Other multi-bit address representations are possible, and no particular address representation is required.

Some compute workloads exhibit regular memory access patterns where memory accesses are address-aligned across memory modules 108. For example, memory location 110 at address "0:2" of memory module 108-0 is address-aligned with the memory location at address "1:2" of memory module 108-1 which is address-aligned with the memory location at address "2:2" of memory module 108-2 because all three memory locations have the same module-relative address (in this example "2").

In the case where data to be accessed from two or more memory modules is address-aligned, a single memory access command having complete address information can be sent to access multiple address-aligned memory locations. For example, memory controller 102 can send (e.g., broadcast) a single memory access command specifying "2" as the module-relative address and access the data stored at memory locations "0:2", "1:2" and "2:2". For example, the single memory access command might be broadcast by memory controller 102 on command/address bus 106 to all memory modules 108 specifying "2" as the module-relative address that unambiguously identifies the memory location to be accessed at each of memory modules 108.

However, if the data to be accessed in two or more of memory modules 108 is not addressed-aligned, then multiple memory access commands may need to be sent by memory controller 102. For example, if the data to be accessed is stored at memory locations "0:2" and "1:3", then two memory access commands specifying different addresses may need to be sent by memory controller 102 via command/address bus 106.

However, with the near-memory address generation units associated with memory modules 108, a single memory access command having incomplete address information can be sent by memory controller 102 via command/address bus 106 for accessing data stored at different unaligned memory locations across two or more of memory modules 108. For example, the command may access data stored at memory locations "0:2", "1:3" and "2:0" where some or all of the module-relative address may be generated by the near-memory address generation units associated with memory modules 108. For example, a first near-memory address generation unit associated with memory module 108-0 may generate module-relative address "2" based on memory module 108-0 receiving the command from memory controller 102 via command bus 106. A second near-memory address generation unit associated with memory module 108-1 may generate module-relative address "3" based on memory module 108-1 receiving the command from memory controller 102 via command bus 106. And a third near-memory address generation unit associated with memory module 108-2 may generate module-relative address "0" based on memory module 108-2 receiving the command from memory controller 102 via command bus 106.

Incomplete Address Information

As used herein, a memory access command having "incomplete" address information encompasses a command sent by memory controller 102 via command/address bus 106 to two or more of memory modules 108 where some or all of the module-relative address is generated near-memory. As mentioned, the module-relative address may encompass the portion of a complete address that identifies the memory location of a memory module addressed by the complete address to be accessed by the command. In contrast, a memory access command having "complete" address information may encompass a command sent by memory controller 102 via command/address bus 106 to two or more memory modules 108 where the entire module-relative address may be specified by the command and no portion of the module-relative address portion may be generated near-memory.

According to some embodiments, a memory access command having incomplete address information may not specify any portion of the module-relative address. In this case, the entire module-relative address may be generated near-memory. For example, a memory access command having incomplete address information may not specify a row address nor specify a column address. In this case, the row and column addresses may be generated near-memory by near-memory address generation units. Note that because of the near-memory address generation units, different row and column addresses can be generated near-memory for different memory modules being accessed such as the case when data is not address-aligned across the memory modules. And in that case where the data is not address-aligned across the memory modules to be accessed, because of the near-memory address generation units, memory controller 102 need only send a single memory access command via command/address bus 106 and does not need to send a separate memory access command for each different module-relative address, thereby conserving bandwidth and power consumption of command/address bus 106.

According to some embodiments, a memory access command having incomplete address information may specify only partial address information such as only some but not all of the module-relative address. For example, a memory access command having incomplete address information may specify only a row address or only a column address common to the memory modules being accessed but not specify both a row address and a column address or otherwise specify a complete address or specify all the module-relative address. In this case, the missing portion of module-relative address may be generated near-memory.

For example, a memory access command having incomplete address information may specify a row address command to the memory modules being accessed but not specify a column address. In this case, the column addresses may be generated near-memory by near-memory address generation units. Note that because of the near-memory address generation units, different column addresses can be generated near-memory for different memory modules being accessed such as the case when data is not address-aligned across the memory modules. And in that case where the data is not address-aligned across the memory modules to be accessed, because of the near-memory address generation units, memory controller 102 need only send a single memory access command via command/address bus 106 and does not need to send a separate memory access command for each different column address, thereby conserving bandwidth and power consumption of command/address bus 106.

As another example, a memory access command having incomplete address information may specify a column address command to the memory modules being accessed but not specify a row address. In this case, the row addresses may be generated near-memory by near-memory address generation units. Note that because of the near-memory address generation units, different row addresses can be generated near-memory for different memory modules being accessed such as the case when data is not address-aligned across the memory modules. And in that case where the data is not address-aligned across the memory modules to be accessed, because of the near-memory address generation units, memory controller 102 need only send a single memory access command via command/address bus 106 and does not need to send a separate memory access command for each different row address, thereby conserving bandwidth and power consumption of command/address bus 106.

In some embodiments, a memory access command having incomplete address information specifies a complete address for some but not all of the two or more of memory modules 108 being accessed. In this case, near-memory address generation units can generate addresses near-memory for the memory module(s) for which the command does not provide a complete address.

In some embodiments, a memory access command having incomplete address information specifies a dummy address such as, for example, a dummy address that is compatible with an existing memory interface specification or standard. In this case, near-memory address generation units can generate address near-memory for all memory modules being accessed by the command. Such a command may be considered to be functionality equivalent to a memory access command that does not specify any address information.

Memory access commands having incomplete address information with near-memory address generation can overcome bandwidth limitations of command/address bus 106 for irregular and sparse compute workloads including machine learning and large-scale graph analytic workloads that manifest irregularity in memory accesses such as accessing data in memory modules 108 at memory locations that are not addressed aligned.

PIM Support

Memory access commands having incomplete address information with near-memory address generation can support (e.g., efficiently support) PIM solutions. For example, where the same PIM operation (e.g., multiply or add) is to be applied to data stored across two or more of memory modules 108, a single memory access command specifying the PIM operation can be sent by memory controller 102 via command/address bus 106 to access the data and accomplish the operation at each of the two or more memory modules, even where some or all of the memory locations at which the data is stored is not address-aligned across the two or more memory modules. The single memory access command can be sent by memory controller 102 via command/address bus 106 as opposed to memory controller 102 having to send multiple memory access commands via command/address bus 106 to access the data and accomplish the PIM operation at each of the two or more memory modules. By doing so over multiple memory accesses having PIM operations to be applied in parallel to two or more of memory modules 108, the bandwidth bottleneck of command/address bus 106 can be alleviated for certain compute workloads. Further, where no address information or only partial address information is specified in the command, power consumption may be conserved in sending the command by memory controller 102 via command/address bus 106 compared to when memory controller 102 sends a memory address command specifying complete address information via command/address bus 106 because fewer bits are sent via command/address bus 106.

Near-memory PIM solutions can support (e.g., efficiently support) irregular and sparse memory accesses such as those found with certain compute workloads including but not limited to recommendation based artificial neural network computation, large-scale graph analytics, sparse computations in machine learning and others. PIM solutions place compute logic near-memory to handle lightweight, data-intensive computations, reducing the host's data bus bandwidth demands and freeing the host to focus on compute-intensive calculations such as matrix math.

However, as mentioned, PIM solutions can be limited by the shared command (address) bus shared by memory modules such as, for example, shared command/address bus 106 shared by memory modules 108. For example, shared command/address bus 106 may be, but is not limited to, a shared command/address bus between banks within a channel of DRAM memory (e.g., synchronous dynamic random-access memory (SDRAM), graphics double data rate synchronous dynamic random-access memory (GDDR), high-bandwidth memory (HBM), etc.) In this example, the banks are represented by memory modules 108 in FIG. 1.

A number of factors can limit the effectiveness of PIM solutions. For one, the bandwidth of shared command/address bus 106 can be designed for non-PIM solution implementations and more regular compute workloads that encompass largely address-aligned memory accesses. As such, while PIM solutions can alleviate the bottleneck on the data bus, they can introduce a bottleneck on shared command/address bus 106, especially with irregular and sparse compute workloads that encompass more memory accesses that are not address-aligned across memory modules 108.

Another factor that can limit the effectiveness of PIM solutions may be the sparse and irregular memory access of some compute workloads. For regular workloads in which data is address-aligned across memory modules 108, a single broadcast PIM command can be sent by memory controller 102 via command/address bus 106 to access multiple address-aligned memory locations across memory modules 108. FIG. 2 illustrates an example series of memory access commands that may be sent by memory controller 102 via command/address bus 106 when data stored in memory locations is address-aligned across memory modules 108.

In the example of FIG. 2, three memory access commands are sent by memory controller 102. Each of the three memory access commands is a broadcast command for receipt by each of memory modules 108. Each of the three commands instructs each memory module to perform an operation "OP-1" (e.g., load, multiply or add) on data stored at a module-relative address specified by the command. Since the data is address-aligned across memory modules 108, broadcast commands can be used.

For example, assuming the operation "OP-1" is a PIM operation such as multiply or add. First command 212 instructs the PIM unit at each memory module to perform the operation "OP-1" using operand "X-1" on the data stored at memory location at module-relative address "0" of the memory module. For example, assuming the PIM operation "OP-1" is multiply and the operand "X-1" is 5, first command 212 may cause the data stored at memory location "0:0" of memory module 108-0 to be multiplied by 5, the data stored at memory location "1:0" of memory module 108-1 to be multiplied by 5 and the data stored at memory location "2:0" of memory module 108-2 to be multiplied 5. Note that since the data to be multiplied is stored at the same module-relative address ("0") at each of memory modules 108, a single broadcast command can be sent by memory controller 102 via command/address bus 106 to parallelize the PIM operation across memory modules 108. Likewise, for the second broadcast command of FIG. 2 sent after the first broadcast command except for module-relative address "1" and different operand "X-2" and the third broadcast command sent after the second broadcast command except for module-relative address "2" and different operand "X-3". Thus, in this example, because the data to be multiplied by the different operands "X-1", "X-2" and "X-3" is address-aligned across memory modules 108, only three broadcast commands need to be sent by memory controller 102 via command/address bus 106. Memory address 214 represents a broadcast memory address using the notation earlier described where the asterisk '*' preceding the colon represents all memory modules 108 that share command/address bus 106 and the '1' following the colon represents a module-relative address.

While using broadcast memory access commands to limit the use of shared command/address bus 106 is possible when data is address-aligned across memory modules 108, such use may not be possible when the data is not address-aligned. FIG. 3 illustrates an example series of memory access commands that may be sent by memory controller 102 via command/address bus 106 when data stored in memory locations is not address-aligned across memory modules 108. The series of memory access commands of FIG. 3 accomplish a similar computation as the series of memory access commands of FIG. 2. However, since the data is not address-aligned in the example of FIG. 3, nine memory access commands may be sent by memory controller 102 via shared command/address bus 106 as opposed to only the three that are sent in the example of FIG. 2. In particular, in the example of FIG. 3, a separate memory access command may be sent for each different memory location. In particular, the first three commands of the command series of FIG. 3 accomplish a computation similar to the first broadcast command of FIG. 2, the next three commands of the command series of FIG. 3 accomplish a similar computation to the second broadcast command of FIG. 2, and the final three commands of the command series of FIG. 3 accomplish a similar computation as the third broadcast command of FIG. 2, but with different and non-address-aligned memory accesses. However, since the data in the example of FIG. 3 to be operated on at memory locations of memory modules 108 is not address-aligned, more memory access commands may be sent by memory controller 102 via command/address bus 106 to accomplish the same computation as the fewer commands sent in the example of FIG. 2 operating on address-aligned data.

Memory access command 316 is representative of the other memory access commands in the series of commands of FIG. 3. Like the other memory access commands in the series, and in contrast to broadcast memory access command 212 of FIG. 3, memory access command 316 addresses a particular memory location "0" in one memory module "0". Accordingly, memory address 318 is representative of the other memory addresses specified in the memory access commands in the series of FIG. 3. In particular, like the other memory addresses specified by the other commands in the series, and in contrast to the broadcast memory address 214, memory address 318 addresses a particular memory location "2" of one memory module "1".

Thus, while PIM solutions may not reach a bandwidth limit of command/address bus 106 for regular compute workloads having largely address-aligned memory accesses, such a limit may be reached with sparse or irregular compute workloads having many memory accesses that are not address-aligned because of the greater number of memory access commands that may be sent by memory controller 106 via command/address bus 106 to accomplish the same computation.

According to some embodiments, PIM solutions are supported with near-memory address generation that allows for addresses to be generated near-memory such that broadcast or multicast memory access commands can be used to accomplish parallel memory accesses across multiple of memory modules 108 even where the data access is not address aligned.

Example Memory Module

Figure 4:
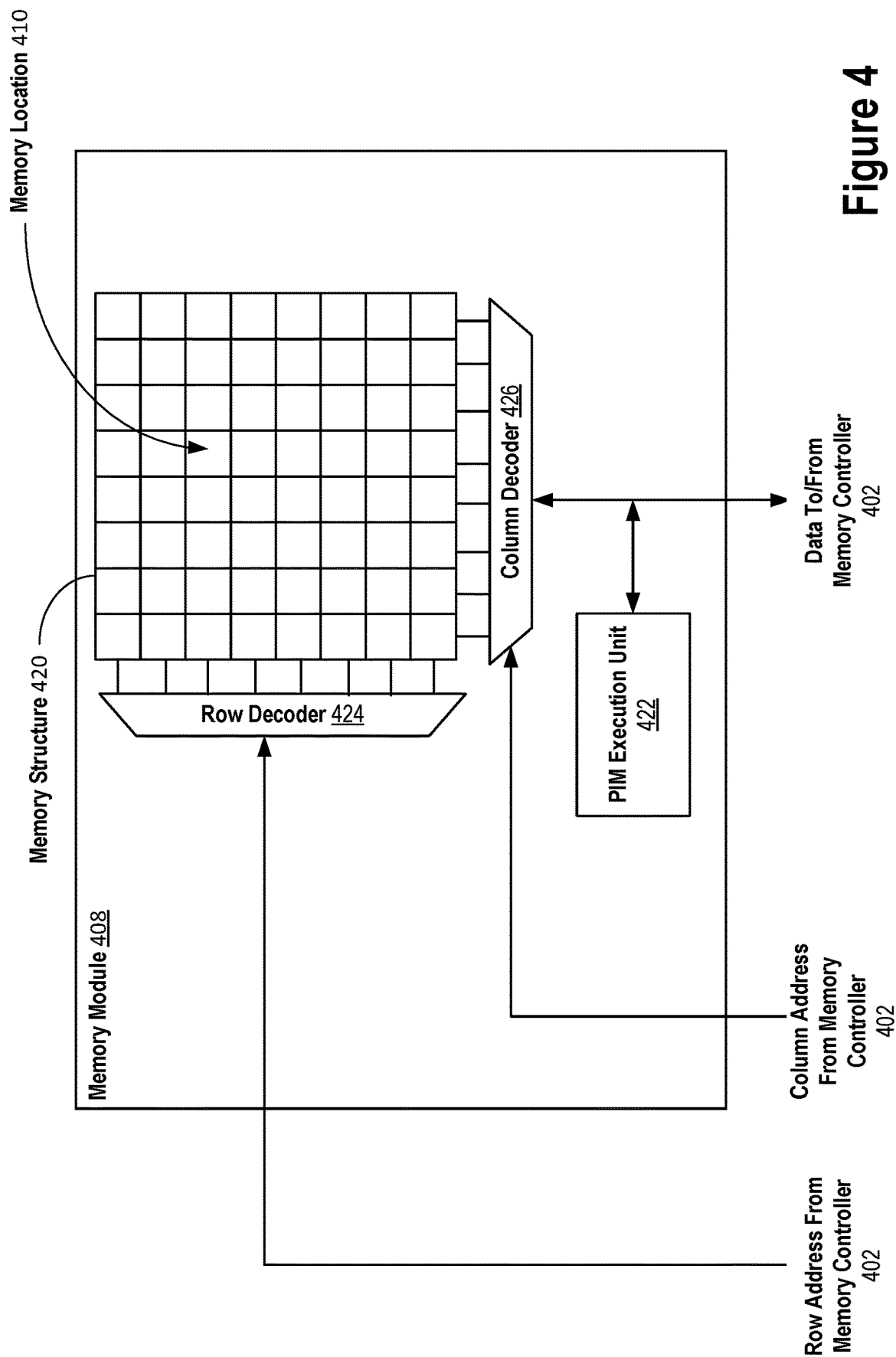
FIG. 4 illustrates an example memory module without near-memory address generation capabilities.

FIG. 4 is a schematic diagram of an example memory module without near-memory address generation capabilities. Memory module 408 may include memory structure 420 that provides a number of memory locations of which memory location 410 is one example. Memory module 408 may be electrically connected to memory controller 402 via a command/address bus. For example, memory module 408 could be one of memory modules 108 of FIG. 1 connected via command/address bus 106 to memory controller 102. Accordingly, memory controller 402 could be memory controller 102 of FIG. 1, for example.

In this example, memory structure 420 has a grid or table configuration where memory locations are arranged in rows and columns. However, memory structure 420 could be implemented as an array of memory locations. Alternatively, memory structure 420 can be three-dimensional structure such as were grids or tables of memory structures are stacked on each other. Memory structure 420 is not limited to any particular arrangement of memory locations and virtually any memory structure having addressable memory locations may be used.

Memory module 408 also includes PIM execution unit 422 for performing near-memory computation on data access from memory cells of memory structure 420. For example, PIM execution unit 422 may encompass one or more multiply-and-add units, one or more reducers for matrix-vector multiplication operations, or other sub-units for operating on data accessed from memory structure 420.

In operation, memory controller 402 may send memory access commands via the command/address bus 106 for receipt at memory module. The memory access commands may specify addresses. A specified address can identify a memory location (e.g., 410) of memory structure 420 of memory module 408. For example, the specified address can have a row address component that is input to row decoder 424 and a column address component that is input to column address decoder 426. The combination of the row address and the column address specifies a memory location (e.g., 410) that is to be accessed. On a load (or read) operation, the data at the memory location is sent to PIM execution unit 422 and/or back to the host (e.g., memory controller 402) for computation based thereon. Each memory location of memory structure 420 may store one or more bytes of data.

Memory module 408 may include other components that for simplicity are not shown in FIG. 4 such as, for example, row buffers and input/output drivers.

Memory Module with Near-Address Generation Unit

Figure 5:
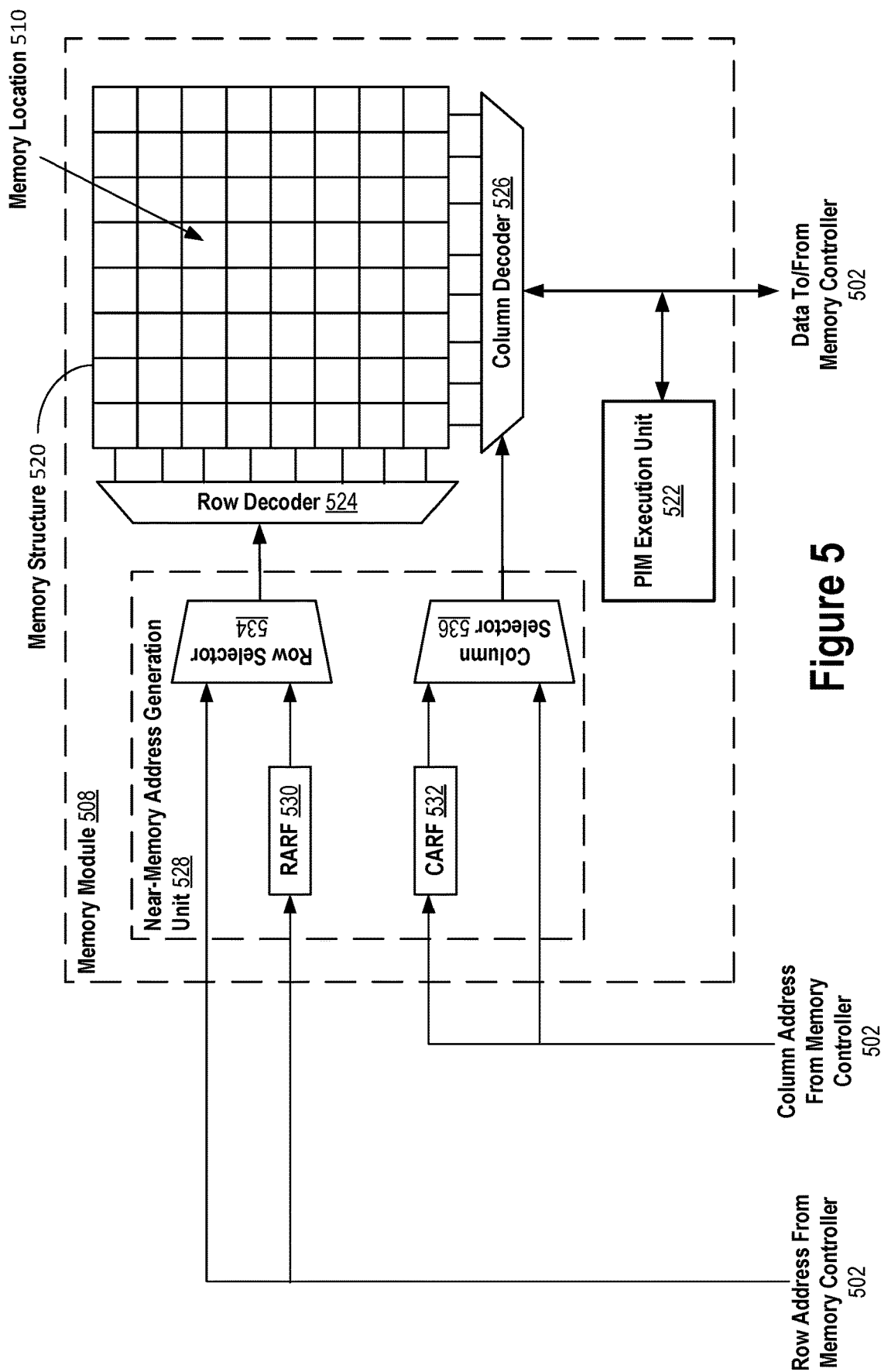
FIG. 5 depicts an example memory module including a near-memory address generation unit for generating addresses near-memory for memory access commands specifying incomplete address information, according to some embodiments.

FIG. 5 is a schematic diagram of example memory module 508 including a near-memory address generation unit 528 for generating addresses near-memory for memory access commands specifying incomplete address information, according to some embodiments. Like memory module 408 of FIG. 4, memory module 508 may include memory structure 520 that provides a number of memory locations of which memory location 510 is one example. Memory module 508 may be electrically connected to memory controller 502 via a command/address bus. For example, memory module 508 could be one of memory modules 108 of FIG. 1 connected via command/address bus 106 to memory controller 102. Accordingly, memory controller 502 could be memory controller 102 of FIG. 1, for example. Memory module 508 may include PIM execution unit 522, row decoder 524 and column decoder 526 also like memory module 408 of FIG. 4.

However, unlike memory module 408 of FIG. 4, memory module 508 may include near-memory address generation unit 528 for generating addresses near-memory for memory access commands specifying incomplete address information. Within near-memory address generation unit 528 is row address register file (or just "RARF" for brevity) 530 and column address register file (or just "CARF" for brevity) 532. RARF 530 may store one or more row addresses for input to row decoder 524 when selected to be generated by row selector 534. Similarly, CARF 532 may store one or more column addresses for input to column decoder 526 when selected to be generated by column selector 536. In alternative embodiments, it may be beneficial to incorporate near-memory address generation unit in an integrated circuit separate from (but still physically proximate to) memory module 508 as this would enable conventional memory modules to be used resulting in potentially beneficial costs in an embodiment of this invention.

Row selector 534 and column selector 536 may be controlled for memory access commands sent by memory controller 502 via the command/address bus. In particular, row selector 534 and column selector 536 allow memory controller 502 to send memory access commands with incomplete address information for which a row address and/or a column address is generated from RARF 530 and/or CARF 532, respectively. Row selector 534 and column selector 536 also allow memory controller 502 to send memory access command for which address information is not generated near-memory by near-memory address generation unit 582.

For example, memory controller 502 can send a memory access command specifying an address that includes both the row address and the column address. In this case, row selector 534 may be configured to accept as input the row address specified in the memory access command and not accept as input a row address generated from RARF 530 for the command. Similarly, column decoder 526 may be configured to accept as input the column address specified in the memory access command and not accept as input a column address generated from CARF 532 for the command. Alternatively, in the context of this example as may be the case with DRAM, phase-change memory, resistive memory or other memory structures that organize memory locations into rows and columns memory controller 502 can send a memory access command specifying a row address, followed by another memory access command specifying a column address.

As another example, memory controller 502 can send a memory access command having incomplete address information that does not specify a row address nor a column address. In this case, row selector 534 may be configured to accept as input the row address generated from RARF 530 for the command and column selector 536 may be configured to accept as input the column address generated from CARF 532 for the command.

As yet another example, memory controller 502 can send a first memory access command having incomplete address information that does not specify a row address followed by a second memory access command having incomplete address information that does not specify a column address. In this case, row selector 534 may be configured to accept as input the row address generated from RARF 530 for the first command and column selector 536 may be configured to accept as input the column address generated from CARF 532 for the second command.

As yet another example, memory controller 502 can send a first memory access command having incomplete address information that does not specify a row address followed by a second memory access command that specifies a column address. In this case, row selector 534 may be configured to accept as input the row address generated from RARF 530 for the first command and column selector 536 may be configured to accept as input the column address specified in the second command and not accept as input a column address generated from CARF 532 for the second command.

As yet another example, memory controller 502 can send a first memory access command specifying a row address followed by a second memory access command having incomplete address information that does not specify a column address. In this case, row selector 534 may be configured to accept as input the row address specified in the first command and not accept as input a row address generated from RARF 530 for the first command and column selector 536 may be configured to accept as input the column address generated from CARF 532 for the second command.

As yet another example, memory controller 502 can send a memory access command having incomplete address information that specifies one of a row address or a column address but does not specify the other. In this case, one of row selector 534 or column selector 536 may be configured to accept as input the row address or the column address, respectively, from RARF 530 or CARF 532, respectively, for the command, and the other of row selector 534 or column selector 536 may be configured to accept as input the row address or the column address, respectively, specified in the memory access command.

Program Address Command

In some embodiments, a row address and/or a column address is pre-programmed in RARF 530 and/or CARF 532, respectively, by one or more program address commands sent by memory controller 502 via the command/address bus. The pre-programmed addresses can then be generated near-memory by near-memory address generation unit 528 for one or more subsequent memory access commands having incomplete address information sent by memory controller 502.

For example, memory controller 502 can send a program address command via the command/address bus to memory module 508 specifying an address that includes both a row address and a column address. The row address can be stored in RARF 530 and the column address stored in CARF 532. Then, one or more subsequent memory access commands having incomplete address information can be sent by memory controller 502 via the command/address bus to memory module 508. The pre-programmed row address and the pre-programmed column address can be generated near-memory from RARF 530 and CARF 532 for each of these subsequent memory access commands having incomplete address information.

As another example, memory controller 502 can send a program address command via the command/address bus to memory module 508 specifying a row address or a column but not specifying both a row address and a column address. If a row address is specified, it can be stored in RARF 530. On the other hand, if a column address is specified, it can be stored in CARF 532. Then, one or more subsequent memory access commands having incomplete address information can be sent by memory controller 502 via the command/address bus to memory module 508. The pre-programmed row address or the pre-programmed column address can be generated near-memory from RARF 530 or CARF 532, respectively for each of these subsequent memory access commands having incomplete address information. The subsequent memory access commands may specify the other of the row address or the column address that is pre-programmed and generated near-memory.

In some embodiments, RARF 530 and/or CARF 532 contains multiple storage locations capable of storing multiple pre-programmed addresses. Each such storage location may be associated with an index (e.g., 0, 1, 2, etc.) A pre-programmed address may be referenced in a memory access command having incomplete address information by its index.

For example, a program address command may be sent by memory controller 502 to pre-program a row address at index 1 of RARF 530 and to pre-program a column address at index 1 of CARF 532. Then, a subsequent memory access command sent by memory controller 502 can specify index 1 and the pre-programmed row address and column address stored at index 1 in the RARF 530 and CARF 532, respectively, may be generated near-memory for the command.

A memory access command may specify different indices. For example, a memory access command may specify an index for RARF 530 and a different index for CARF 532. In this case, the pre-programmed row address at the index specified for RARF 530 may be generated near-memory for the command and the pre-programmed column address at the different index specified for CARF 532 may be generated near-memory for the command.

A memory access command may specify just an index for RARF 530 or just an index for CARF 532. In this case, the pre-programmed row address or the pre-programmed column address at the RARF 530 or CARF 532 index specified in the command may be generated near-memory for the command and the other of the row address and the column address may be specified by the command.

As indicated, once RARF 530 and/or CARF 532 are pre-programmed or otherwise store addresses, subsequent memory access commands having incomplete address information may be sent by memory controller 502 via the command/address bus without having to specify the addresses stored in each such subsequent memory access command. As a result, the subsequent memory access commands do not consume the bandwidth of the command/address bus that they would consume if the stored address were specified in the memory access commands because fewer bits are can be transmitted with each such command.

In some embodiments, different memory modules (e.g., 108-0, 108-1, 108-2) are pre-programmed with or otherwise store different row and/or column addresses in each of their respective RARFs and/or CARFs. This allows a single subsequent broadcast memory access command having incomplete address information to be sent by memory controller 502 via the command/address bus to access data at each of the different memory modules where the data is not address-aligned (e.g., stored at different row and/or column addresses) across the memory modules by leveraging the near-memory generated row and/or column addresses stored in the respective RARFs and/or CARFs.

In some embodiments, pre-programming of row and/or column address in RARF 530 and CARF 532 by program address commands sent by memory controller 502 is performed during idle cycles on the command/address bus. Then, the pre-programmed row and/or column addresses are generated near-memory from RARF 530 and/or CARF 532 repeatedly for multiple subsequent memory access commands sent by memory controller 502. In other words, because of the near-memory address generation capability provided by RARF 530 and/or CARF 532, the bandwidth of the command/address bus consumed to send the program address command(s) via the command/address bus may be amortized over multiple subsequent memory access commands.

Address Calculation Unit

Figure 6:
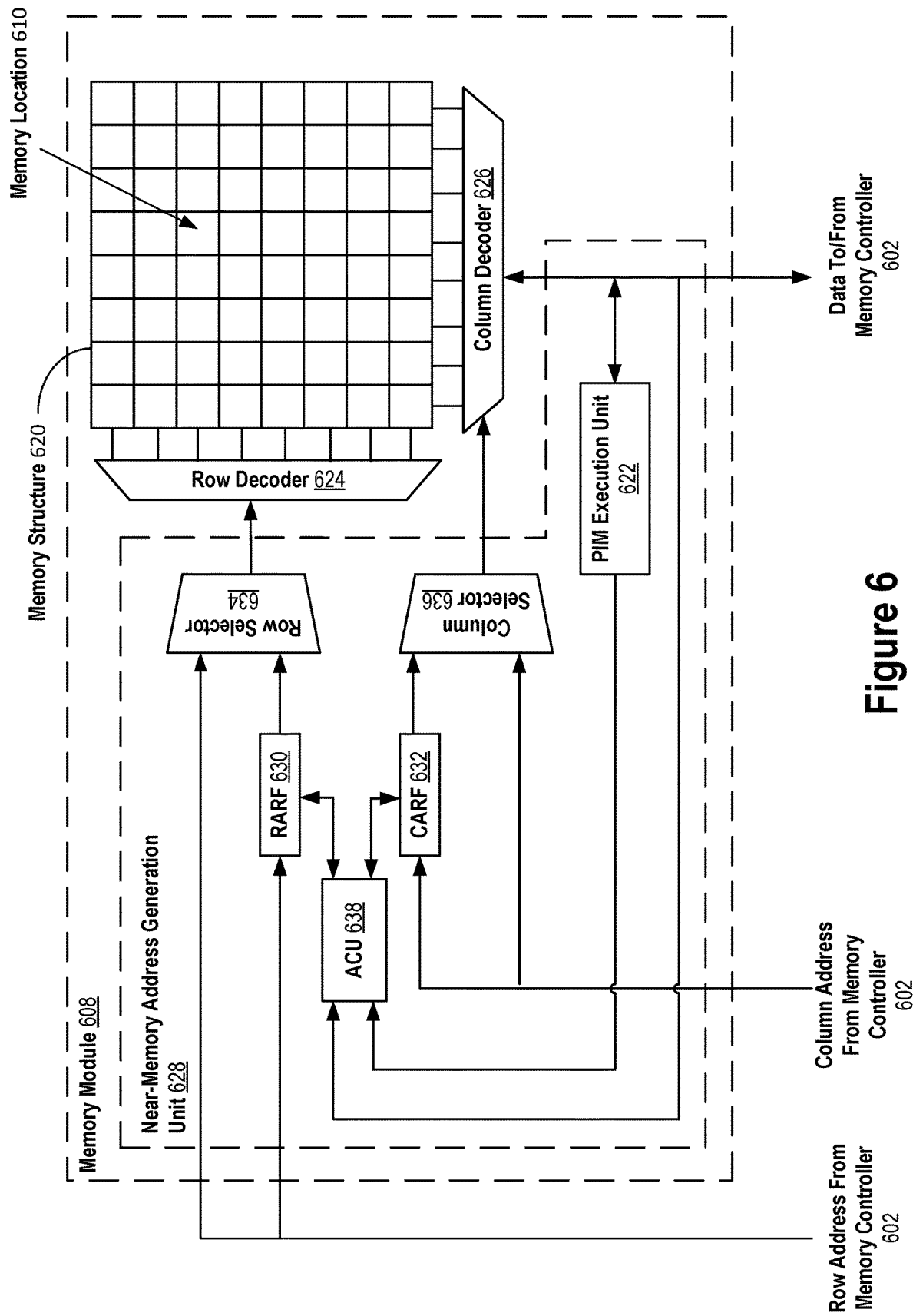
FIG. 6 depicts an example memory module including a near-memory address generation unit with an address calculation unit for generating addresses near-memory for memory access commands specifying incomplete address information, according to some embodiments.

In some embodiments, the near-memory address generation unit includes an address calculation unit to provide near-memory address calculation functionality to a memory module. FIG. 6 is a schematic diagram of example memory module 608 including a near-memory address generation unit 628 for generating addresses near-memory for memory access commands specifying incomplete address information, according to some embodiments. Like memory module 508 of FIG. 5, memory module 608 may include memory structure 620 that provides a number of memory locations of which memory location 610 is one example. Memory module 608 may be electrically connected to memory controller 602 via a command/address bus. For example, memory module 608 could be one of memory modules 108 of FIG. 1 connected via command/address bus 106 to memory controller 102. Accordingly, memory controller 602 could be memory controller 102 of FIG. 1, for example. Memory module 608 may include PIM execution unit 622, row decoder 624, column decoder 626, RARF 630, CARF 632, row selector 634 and column selector 646 also like memory module 508 of FIG. 5.

However, unlike memory module 508 of FIG. 5, memory module 608 includes address calculation unit 638 electrically connected to RARF 630, CARF 632 and PIM unit 622.

In some embodiments, address calculation unit 638 is configured to increment or decrement the row and/or the column addresses stored in RARF 630 and CARF 632, respectively, using a configurable stride. The stride may be pre-configured within address calculation unit 638. In addition, or alternatively, the stride may be pre-programmed in address calculation unit 638 by a memory access command having incomplete address information sent from memory controller 602 via the command/address bus where the stride is specified by the command.

For example, address calculation unit 638 can increment, decrement or multiply a column address stored in CARF 632 after a memory location is accessed in memory structure 620 for a memory access command having incomplete address information received at memory module 608. Likewise, in addition, or alternatively, address calculation unit 638 can increment, decrement or multiply a row address stored in RARF 630 after a memory location is accessed in memory structure 520 for the memory access command. The next memory access command having incomplete address information received by memory module 608 can generate the incremented, decremented or multiplied addresses from RARF 630 and/or CARF 632. This process can continue over a number of memory access commands avoiding the need to consume the bandwidth of the command/address bus by sending multiple program address commands. Instead, the second and subsequent addresses can be calculated by address calculation unit 628 using a single starting address specified by an initial program address command and a sequence of simple computations by address calculation unit 628 using a stride. In some embodiments, address calculation unit 628 may support a range of address computations in addition to incrementing by a stride, including decrementing by a stride, multiplying by a stride, and so on.

In some embodiments, address calculation unit 628 may access or be provided a value computed by PIM execution unit 622 associated with memory structure 620 or a value accessed from memory structure 620 to be used as an address. Address calculation unit 628 may then use such an address to compute row and column addresses to be programmed into RARF 630 and CARF 632. An example of such a use may include reading an address offset value from memory structure 620, adding that address offset value to a predetermined base address of a data structure using PIM execution unit 622, and using address calculation unit 628 to generate the resultant row and column addresses to be programmed into RARF 630 and CARF 632.

In some embodiments, the addition of an offset read from memory structure 620 to a base address stored in RARF 630 or CARF 632 may be performed by address calculation unit 628 instead of PIM unit 622.

Address calculation units in multiple memory modules allows a single memory access command having incomplete address to be sent by the memory controller or host via the command/address bus to be applied to different addresses in each of the memory modules as the offsets and, possibly, base addresses associated with each memory module can be different as they are separately stored in their respective RARFs/CARFs and/or respective memory structures. The address calculation unit further reduces the bandwidth demand on the command/address bus as the offsets are read from the memory structures associated with each memory module. As such, the offsets do not need to be transmitted over the command/address bus. Note that reading the offsets from memory structures can also be performed via broadcast or multicast memory access command that is sent to multiple memory modules, further reducing command/address bus bandwidth needs.

Example Command Series

Figure 7:
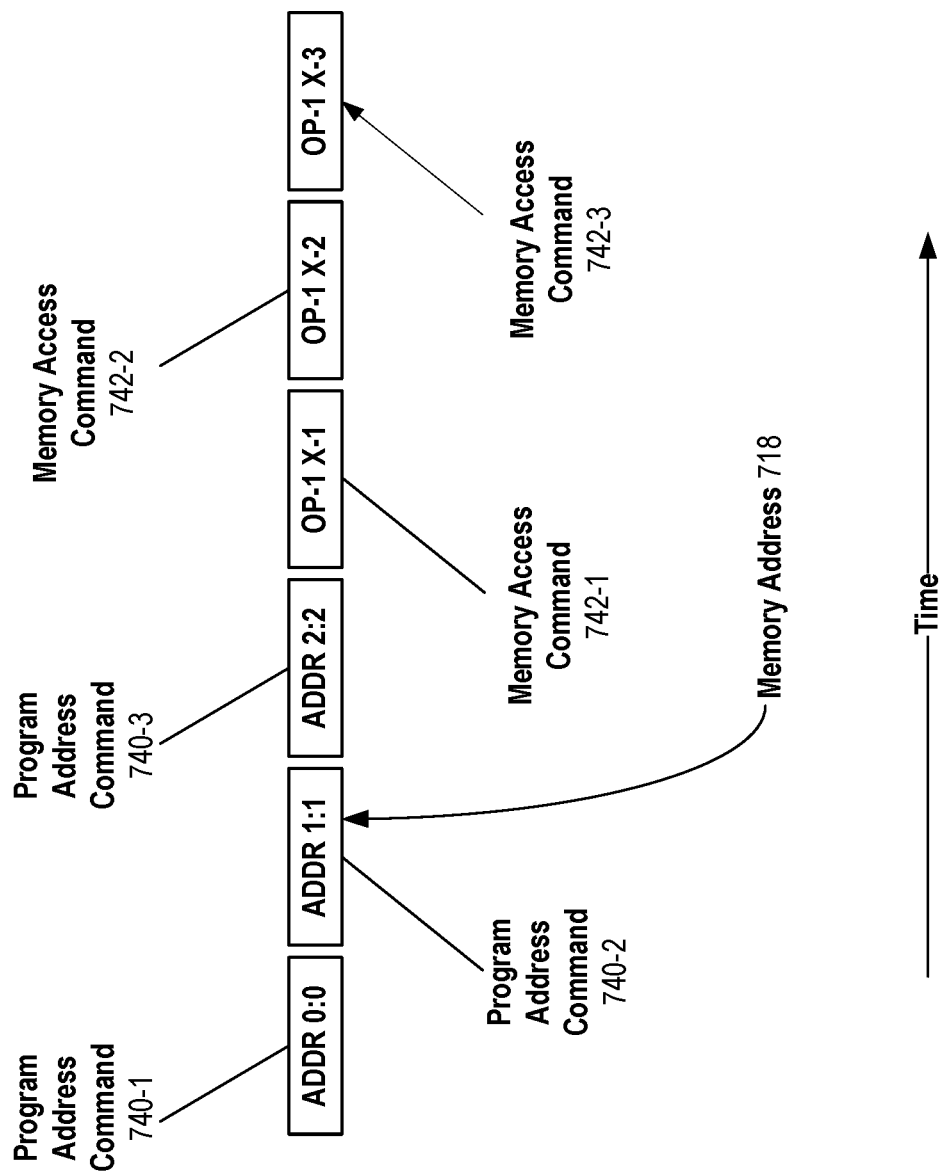
FIG. 7 illustrates a command series for accessing data stored across multiple memory modules, according to some embodiments.

FIG. 7 illustrates an example series of program address commands 740-1, 740-2 and 740-3 and memory access commands 742-1, 742-2 and 742-3 for accessing data stored at memory locations across memory modules 108 that are not address-aligned, according to some embodiments. In this example, there are three memory access commands 742-1, 742-2 and 742-3 for accessing different memory locations in memory modules 108 that are not address-aligned. Starting addresses for near-memory address generation are pre-programmed with memory modules 108 by program address commands 740-1, 740-2 and 740-3 to be used by the first memory access command 742-1. The starting addresses are then incremented by a fixed stride (e.g., 1) for the second memory access command 742-2. Those addresses are then incremented by the fixed stride again for the third memory access command 742-3. In this way, with the near-memory address generation capabilities of memory modules 108, the computation can be accomplished with only six commands sent by memory controller 102 via command/address bus 106 as opposed to nine commands that are required in FIG. 3 described above.

In detail, program address command 740-1 is sent by memory controller 102 to memory module 108-0 via command/address bus 106 to memory module 108-0 to set the module-relative start address for module 108-0 to "0".

Program address command 740-2 is then sent by memory controller 102 to memory module 108-1 via command/address bus 106 to memory module 108-1 to set the module-relative start address for module 108-1 to "1".

Program address command 740-2 is then sent by memory controller 102 to memory module 108-2 via command/address bus 106 to memory module 108-2 to set the module-relative start address for module 108-2 to "2".

Then, memory controller 102 broadcasts memory access command 742-1 having incomplete address information (e.g., address-less) via command/address bus 106 to each of memory modules 108-0, 108-1 and 108-2. Command 742-1 specifies an operation OP-1 and an operand X-1. For example, the operation OP-1 can be a PIM command such as multiply or add. While operation OP-1 can be a PIM command, operation OP-1 can also be a simple memory load command or other command. For example, assuming the operation OP-1 is multiply and the operand X-1 is the number 5, then, based on the module-relative start addresses pre-programmed by program address commands 740, command 742-1 would multiply the data stored at memory location "0:0" of module 108-0 by 5, multiply the data stored at memory location "1:1" of module 108-1 by 5 and multiply the data stored at memory location "2:2" of memory module 108-2 by 5. After each multiplication, the module-relative start addresses of memory modules 108 may be incremented by a fixed stride (e.g., 1) such that the module-relative start addresses are now "1", "2", and "3" for memory modules 108-0, 108-1 and 108-2, respectively.

Then, memory controller 102 broadcasts memory access command 742-2 having incomplete address information (e.g., address-less) via command/address bus 106 to each of memory modules 108-0, 108-1 and 108-2. Command 742-2 specifies the operation OP-1 and a different operand X-2. For example, assuming the operation OP-1 is multiply and the operand X-2 is the number 8, then, based on the current module-relative start addresses, command 742-2 would multiply the data stored at memory location "0:1" of module 108-0 by 8, multiply the data stored at memory location "1:2" of module 108-1 by 8 and multiply the data stored at memory location "2:3" of memory module 108-2 by 8. After each multiplication, the module-relative start addresses of memory modules 108 may be incremented by a fixed stride (e.g., 1) such that the module-relative start addresses are now "2", "3", and "0" for memory modules 108-0, 108-1 and 108-2, respectively.

Then, memory controller 102 broadcasts memory access command 742-3 having incomplete address information (e.g., address-less) via command/address bus 106 to each of memory modules 108-0, 108-1 and 108-2. Command 742-3 specifies the operation OP-1 and a different operand X-3. For example, assuming the operation OP-1 is multiply and the operand X-3 is the number 0, then, based on the current module-relative start addresses, command 742-3 would multiply the data stored at memory location "0:2" of module 108-0 by 0, multiply the data stored at memory location "1:3" of module 108-1 by 0 and multiply the data stored at memory location "2:0" of memory module 108-2 by 0.

Example Command Format

As an example, memory controller 102 and memory modules 108 may support the following commands to support near-memory address generation, in some embodiments:

memory_access_command operation, [mask]
program_[row, col]_address_command memory_module_id, module relative address The first command above represents an example broadcast or a multicast memory access command format having incomplete address information for sending to two or more memory modules which share a command/address bus such as, for example, DRAM banks within a channel of HBM memory. If a broadcast command, then the command can be for all memory modules that share the command/address bus. If a multicast command, then the command specifies a bit mask as a parameter selecting a subset of two or more of all memory modules that share the command/address bus to which the command is directed. Alternatively, the command can have a mask that inhibits the command at a subset of all memory modules.

A broadcast or multicast memory access command may also specify an operation type as a parameter. The operation can be a memory load, for example, However, a PIM operation such as multiply or add for near-memory processing may be specified where the memory modules have PIM capabilities. Notably, unlike a conventional memory access command, the above-memory access command can be sent without specifying any address information or specifying only incomplete address information. And unlike with conventional memory access commands, near-memory address generation units of the memory modules can generate missing addresses or missing address portions near-memory for the above memory access command.

The second command is an example program address command format for sending to a memory module via the shared command/address bus. The command accepts as a parameter an identifier of the memory module to which the command is targeted. The command also accepts an address parameter that can be a row address, a column address, a row and a column address, or other module relative address that may vary depending on the type of program address command. For example, there may be different types of program address commands for programming RARFs and CARFs separately with row address and column address, respectively.

While the program address command presented here programs each memory module separately, in alternate embodiments a broadcast program address command or multicast program address command with an associated mask can program multiple memory modules with the same module relative address. And as mentioned, further variants for the program address command can include programming of row and column addresses or other module relative addresses separately.

Other Considerations

Certain computer memory technology such as hybrid memory cube (or just "HMC" for brevity) and HBM memory may stack many memory layers on top of a base die. Such a base die can potentially house near-memory computation capabilities such as near-memory address generation units 528 and 628 of FIG. 5 and FIG. 6, respectively.

In some embodiments, near-memory address generation units 528 and 628 can be placed close to memory arrays/banks in the memory layers of three-dimensional (3-D) stacked memories or conventional DRAM.

Some embodiments also applicable to other forms of memories besides DRAM, such as non-volatile memories, flash memories, and embedded DRAM.

While some embodiments depict state and logic to associate a single start address to be used with any of the proposed memory access commands, replicating the proposed state and logic for multiple PIM operations can enable multiple start addresses to be tracked by near-memory address generation units or different PIM operations such as tracking different addresses in each memory module for multiply operations and add operations.

In some embodiments, memory controller 102 may employ a deterministic double-data rate (or just "DDR" for short) with memory modules 108. DDR can be supported according to some embodiments by synchronizing between memory structures 108 appropriately. For example, a memory access command necessitating a DRAM row open (activation) may take longer than a DRAM row buffer hit. To allow a broadcast or multicast memory access command having incomplete address information to access different addresses across different memory modules, memory controller 102 could be augmented to synchronize row opens across the different memory modules.

CONCLUSION

Reference herein to "some embodiments" means that a particular feature, structure, or characteristic is described in connection with and can be included in at least one embodiment of the invention. The appearances of the phrases "in some embodiments" and "according to some embodiments" in various places in the specification are not necessarily all referring to the same embodiment, nor are separate or alternative embodiments mutually exclusive of other embodiments.

Although some of various drawings illustrate a number of logical stages in a particular order, stages that are not order dependent may be reordered and other stages may be combined or broken out. While some reordering or other groupings are specifically mentioned, the ordering and groupings presented herein are not an exhaustive list of alternatives.

In the foregoing detailed description and in the appended claims, although the terms first, second, etc. are, in some instances, used herein to describe various elements, these elements should not be limited by these terms. These terms are only used to distinguish one element from another. For example, a first computing device could be termed a second computing device, and, similarly, a second computing device could be termed a first computing device. The first computing device and the second computing device are both computing devices, but they are not the same computing device.

As used in the foregoing detailed description and in the appended claims, the singular forms "a," "an," and "the" are intended to include the plural forms as well, unless the context clearly indicates otherwise. As used in the foregoing detailed description and in the appended claims, the term "and/or" refers to and encompasses any and all possible combinations of one or more of the associated listed items.

As used in the foregoing detailed description in the appended claims, the terms "based on," "according to," "includes," "including," "comprises," and/or "comprising," specify the presence of stated features, integers, steps, operations, elements, and/or components, but do not preclude the presence or addition of one or more other features, integers, steps, operations, elements, components, and/or groups thereof.

As used in the foregoing detailed description and in the appended claims, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

In the foregoing specification, embodiments of the invention have been described with reference to numerous specific details that may vary from implementation to implementation. The specification and drawings are, accordingly, to be regarded in an illustrative rather than a restrictive sense.

The invention claimed is:

1. A memory controller comprising:
   a command logic configured to send a memory access command having no or partial address information via a connection between the memory controller and two or more memory modules, the memory access command for accessing data stored at two or more memory locations, of the two or more memory modules, corresponding to two or more near-memory generated addresses, wherein each memory location of the two or more memory locations is at a different memory module of the two or more memory modules.

2. The memory controller of claim 1, wherein at least two near-memory generated addresses of the two or more near-memory generated addresses are different addresses.

3. The memory controller of claim 1, wherein:
   the command logic is configured to: (a) send, via the connection, a first program address command specifying a first address to a first memory module of the two or more memory modules, and (b) send, via the connection, a second program address command having a second address to a second memory module of the two or more memory modules; and
   the command logic is configured to send the memory access command for accessing, based on the first address and the second address, data stored at the two or more memory locations.

4. The memory controller of claim 1, wherein a particular operation to be performed by two or more processor-in-memory units, of the two or more memory modules, on data stored at the two or more memory locations is specified by the memory access command.

5. The memory controller of claim 4, wherein the particular operation is a multiply operation or an add operation.

6. The memory controller of claim 1, wherein the command logic is configured to send, via the connection, the memory access command having no address information for accessing data stored at the two or more memory locations.

7. The memory controller of claim 1, wherein the command logic is configured to send, via the connection, the memory access command specifying partial address information for accessing data stored at the two or more memory locations.

8. The memory controller of claim 7, wherein the partial address information comprises either: (a) a row address common to the two or more memory locations or (b) a column address common to the two or more memory locations.

9. The memory controller of claim 1, wherein the memory access command includes a mask that inhibits the memory access command at one or more memory modules from a plurality of memory modules that share the connection.

10. The memory controller of claim 1, wherein:
the command logic is configured to send, via the connection, a program address command specifying a particular address to the two or more memory modules; and
the command logic is configured to send, via the connection, the memory access command for accessing, based on the particular address, data stored at the two or more memory locations.

11. The memory controller of claim 1, wherein the command logic is configured to send, via the connection, a plurality of memory access commands for accessing data stored at two or more memory locations, of the two or more memory modules, corresponding to two or more near-memory generated addresses.

12. The memory controller of claim 1, wherein the command logic is configured to send, via the connection, the memory access command specifying a register file index for accessing data stored at the two or more memory locations; and wherein the register file index is capable of being used at the two or more memory modules to generate the two or more near-memory generated addresses.

13. A memory controller comprising:
a command logic configured to:
send a first memory access command having no or partial address information via a connection for accessing data stored in two or more rows, of two or more memory modules, corresponding to two or more near-memory generated row addresses, wherein each row address of the two or more near-memory generated row addresses is at a different memory module of the two or more memory modules; and
send a second memory access command having no or partial address information via the connection for accessing data stored in two or more columns, of the two or more memory modules, corresponding to two or more near-memory generated column addresses, wherein each column address of the two or more near-memory generated column addresses is at a different memory module of the two or more memory modules.

14. The memory controller of claim 13, wherein at least two near-memory generated row addresses of the two or more near-memory generated row addresses are different addresses.

15. The memory controller of claim 13, wherein at least two near-memory generated row addresses of the two or more near-memory generated row addresses are the same row address.

16. The memory controller of claim 13, wherein at least two near-memory generated row addresses of the two or more near-memory generated row addresses are different addresses; and wherein at least two near-memory column addresses of the two or more near-memory generated column addresses are different.

17. A method comprising:
sending, via a connection between a memory controller and two or more memory modules, a memory access command having no or partial address information;
receiving, via the connection, the memory access command at the two or more memory modules;
generating two or more addresses at the two or more memory modules corresponding to two or more memory locations of the two or more memory modules, wherein each memory location of the two or more memory locations is at a different memory module of the two or more memory modules; and
accessing data stored at the two or more memory locations.

18. The method of claim 17, further comprising:
sending, via the connection, two or more program address commands to the two or more memory modules;
wherein one program address command of the two or more program address commands is sent, via the connection, to one respective memory module of the two or more memory modules;
wherein the two or more program address commands specifies two or more different addresses; and
wherein the generating the two or more addresses at the two or more memory modules is based on the two or more different addresses.

19. The method of claim 17, wherein at least two addresses of the two or more addresses are different addresses.

20. The method of claim 17, further comprising:
sending, via the connection, a first program address command specifying a first address to a first memory module of the two or more memory modules;
sending, via the connection, a second program address command having a second address to a second memory module of the two or more memory modules; and
sending the memory access command for accessing, based on the first address and the second address, data stored at the two or more memory locations.

21. The method of claim 17, further comprising:
specifying, in the memory access command, a particular operation to be performed by two or more processor-in-memory units, of the two or more memory modules, on data stored at the two or more memory locations.

22. The method of claim 21, wherein the particular operation is a multiply operation or an add operation.

23. The method of claim 17, further comprising:
sending, via the connection, the memory access command having no address information accessing data stored at the two or more memory locations.

24. The method of claim 17, further comprising:
sending, via the connection, the memory access command specifying partial address information for accessing data stored at the two or more memory locations.

25. The method of claim 24, wherein the partial address information comprises either: (a) a row address common to the two or more memory locations or (b) a column address common to the two or more memory locations.

26. The method of claim 17, wherein
the memory access command includes a mask that inhibits the memory access command at one or more memory modules from a plurality of memory modules that share the connection.

27. The method of claim 17, further comprising:
sending, via the connection, a program address command specifying a particular address to the two or more memory modules; and
sending, via the connection, the memory access command for accessing, based on the particular address, data stored at the two or more memory locations.

28. The method of claim 17, further comprising:
sending, via the connection, a plurality of memory access commands for accessing data stored at two or more memory locations, of the two or more memory modules, corresponding to two or more near-memory generated addresses.

29. The method of claim 17, further comprising:
sending, via the connection, the memory access command specifying a register file index for accessing data stored at the two or more memory locations; and
using the register file index at the two or more memory modules to generate the two or more addresses.

* * * * *